(12) United States Patent
Wang et al.

(10) Patent No.: US 7,796,394 B2
(45) Date of Patent: Sep. 14, 2010

(54) ELECTRICAL CONNECTOR ASSEMBLY HAVING HEAT SINK

(75) Inventors: Qing-Feng Wang, ShenZhen (CN); Ling Tao, ShenZhen (CN); Nan-Hong Lin, Tu-Cheng (TW); Chih-Pi Cheng, Tu-Cheng (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 21 days.

(21) Appl. No.: 12/154,306

(22) Filed: May 22, 2008

(65) Prior Publication Data

US 2008/0291622 A1 Nov. 27, 2008

(30) Foreign Application Priority Data

May 22, 2007 (CN) .......................... 2007 2 0037863

(51) Int. Cl.
H05K 7/20 (2006.01)
H01L 23/34 (2006.01)
H01R 13/00 (2006.01)

(52) U.S. Cl. ....................... 361/719; 257/719; 439/485; 439/487

(58) Field of Classification Search ................ 257/719; 361/719; 439/485, 487
See application file for complete search history.

(56) References Cited

U.S. PATENT DOCUMENTS

| | | | | |
|---|---|---|---|---|
| 4,483,389 A * | 11/1984 | Balderes et al. | ............ | 165/80.3 |
| 5,206,792 A * | 4/1993 | Reynolds | .................... | 361/719 |
| 6,188,577 B1 * | 2/2001 | Liu | ............. | 361/704 |
| 6,205,026 B1 * | 3/2001 | Wong et al. | ................. | 361/704 |
| 6,282,093 B1 * | 8/2001 | Goodwin | .................... | 361/704 |
| 6,501,018 B2 * | 12/2002 | Mayer | ....................... | 174/370 |
| 6,547,580 B1 | 4/2003 | Leavitt et al. | | |
| 6,781,832 B2 * | 8/2004 | Nakamura et al. | .......... | 361/695 |
| 6,950,310 B2 * | 9/2005 | Edwards | .................... | 361/721 |
| 6,952,348 B2 * | 10/2005 | Wu | ............. | 361/719 |
| 7,327,577 B2 * | 2/2008 | Gilliland et al. | ............. | 361/719 |
| 7,382,621 B2 * | 6/2008 | Peng et al. | ................. | 361/719 |
| 2003/0151899 A1 * | 8/2003 | Lee et al. | .................... | 361/719 |
| 2005/0122690 A1 * | 6/2005 | Hood et al. | ................. | 361/709 |

* cited by examiner

Primary Examiner—Gregory D Thompson
(74) Attorney, Agent, or Firm—Andrew C. Cheng; Wei Te Chung; Ming Chieh Chang

(57) ABSTRACT

An electrical connector assembly is provided for connecting an IC chip (2) to a printed circuit board (3). The electrical connector assembly includes a housing (1) engaging with the IC chip, a heat sink (6), a loading plate (4) and a number of first connecting portions (5). The loading plate is located between the heat sink and the housing and has a number of spring plates (41) extending toward the IC chip. The first connecting portions are provided for connecting the heat sink to the printed circuit board.

12 Claims, 6 Drawing Sheets

ELECTRICAL CONNECTOR ASSEMBLY HAVING HEAT SINK

BACKGROUND OF THE INVENTION

1. Field of the Invention

The present invention is directed to an electrical connector assembly, and particularly to an electrical connector assembly having a heat sink for conducting heat away from an IC package.

2. Description of Prior Arts

U.S. Pat. No. 6,547,580 issued on Apr. 15, 2003 discloses an electrical connector assembly for electrically connecting a Land Grid Package (LGP) to a printed circuit board (PCB). The electrical connector assembly includes a base, a number of terminals secured on the base, a cover pivotably mounted to one end of the base, a locking mechanism having an aperture defined in a central portion thereof. The cover may also comprise an integrally formed heat sink to conduct heat away from the LGP. The cover is locked by a pair of locking portions which protrude from opposite ends of the base. The locking mechanism is pivotably mounted to one end of the cover portion and engages with the cover for locking the cover in the closed position.

However, it is complicate to assemble the cover to the base. Additionally, the cover described above could not provide sufficient resilient force to resist against the LGP chip firmly, resulting in poorly electrically contacting the terminals to the PCB.

Hence, it is desirable to provide an improved electrical connector to overcome the aforementioned disadvantages.

SUMMARY OF THE INVENTION

An object of the present invention is to provide an electrical connector assembly having a heat sink that can firmly connect an IC chip to a printed circuit board.

To achieve the above object, an electrical connector assembly is provided for connecting an IC chip to a printed circuit board. The electrical connector comprises a housing having a supporting portion for engaging with the IC chip and a mounting portion for soldering to the printed circuit board and a plurality of contacts mounted to the supporting portion of the housing. The electrical connector assembly further comprises a heat sink having a plurality of first mating portions disposed on a bottom surface thereof, a loading plate and a plurality of first connecting portions. The loading plate is located between the heat sink and the housing and has a plurality of spring plates extending toward the IC chip. The first connecting portion engages with the first mating portion for connecting the heat sink to the printed circuit board.

Advantages of the present invention are to provide a loading plate having a plurality of spring plates resisting against the IC chip firmly for providing a favorable electrical connection between the IC chip and the printed circuit board. Additionally, a plurality of first connecting portions are provided for directly connecting the heat sink to the printed circuit board. It would result in simplifying the assembly of the heat sink to the printed circuit board.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
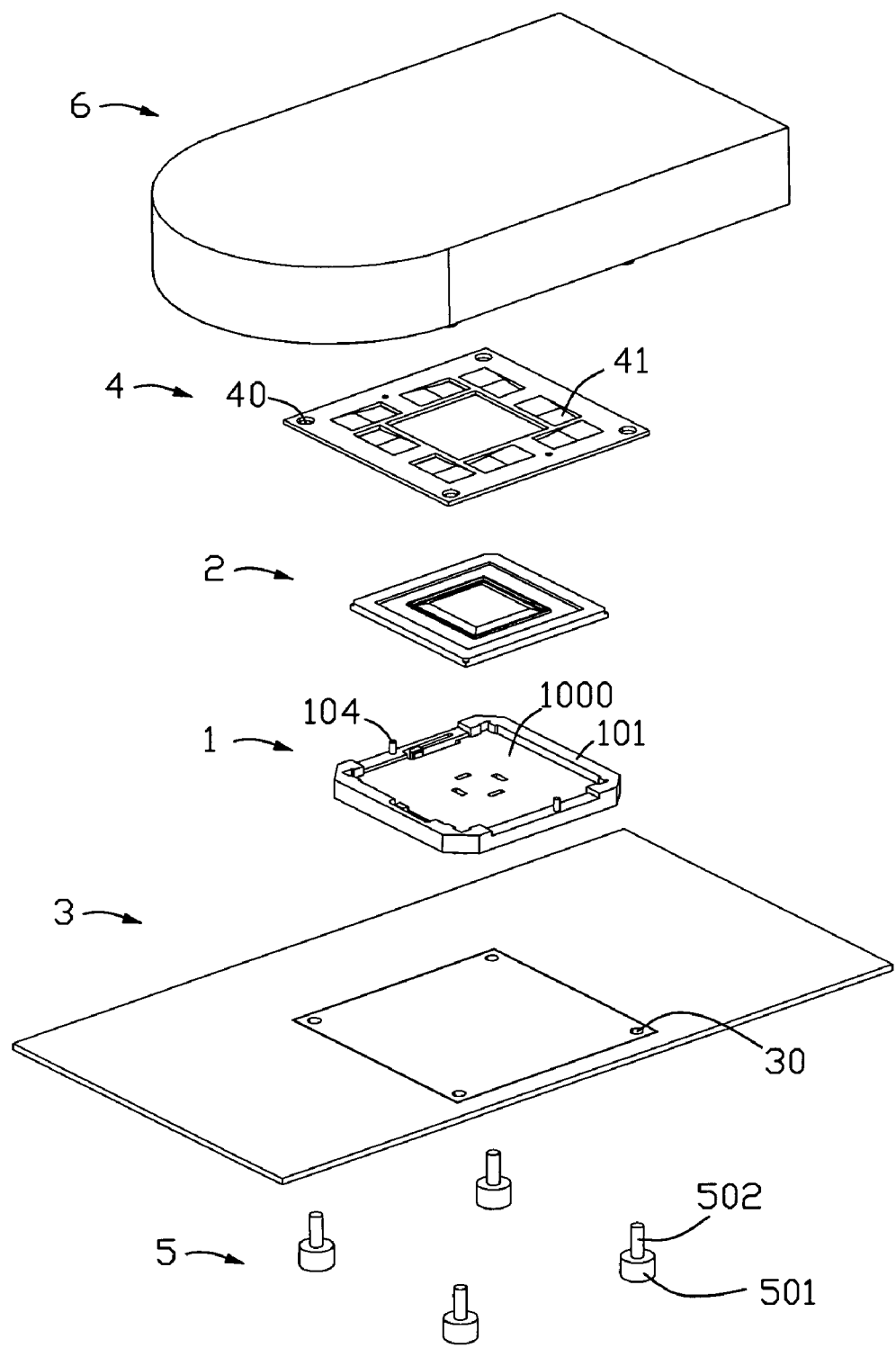
FIG. 1 is an exploded view of an electrical connector assembly in accordance with a first embodiment.
Figure 2:
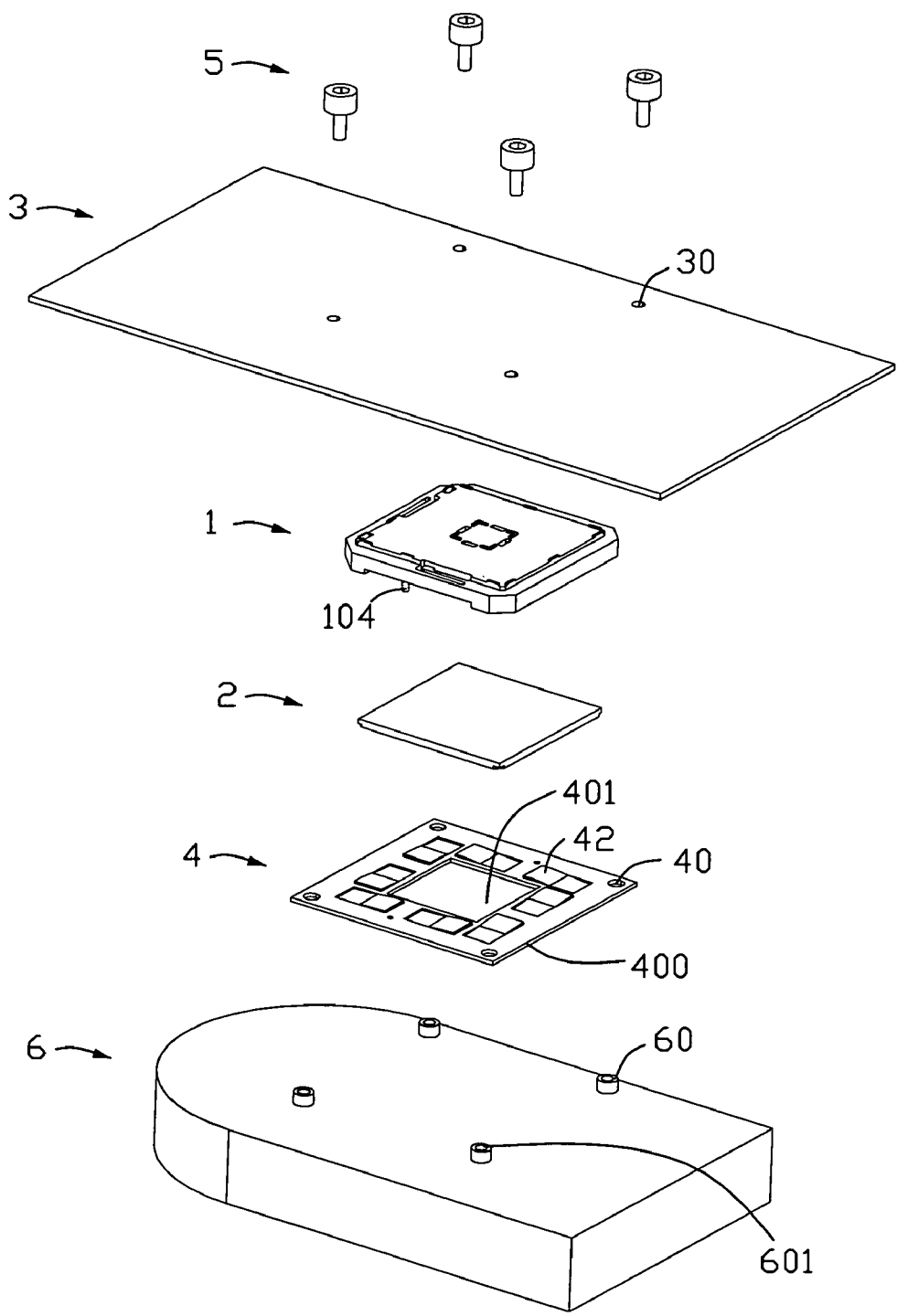
FIG. 2 is an exploded view of the electrical connector assembly of the first embodiment as shown in the FIG. 1, taken from another aspect.

Reference will now be made to the drawing figures to describe the present invention in detail. Referring to FIGS. 1-4, an electrical connector assembly for connecting an IC chip 2 to a printed circuit board 3 comprises a housing 1 mounted on the printed circuit board 3, a heat sink 6, a loading plate 4 located between the heat sink 6, the housing 1 and a plurality of first connecting portions 5 together connecting the heat sink 6 and the loading plate 4 to the printed circuit board 3.

Figure 3:
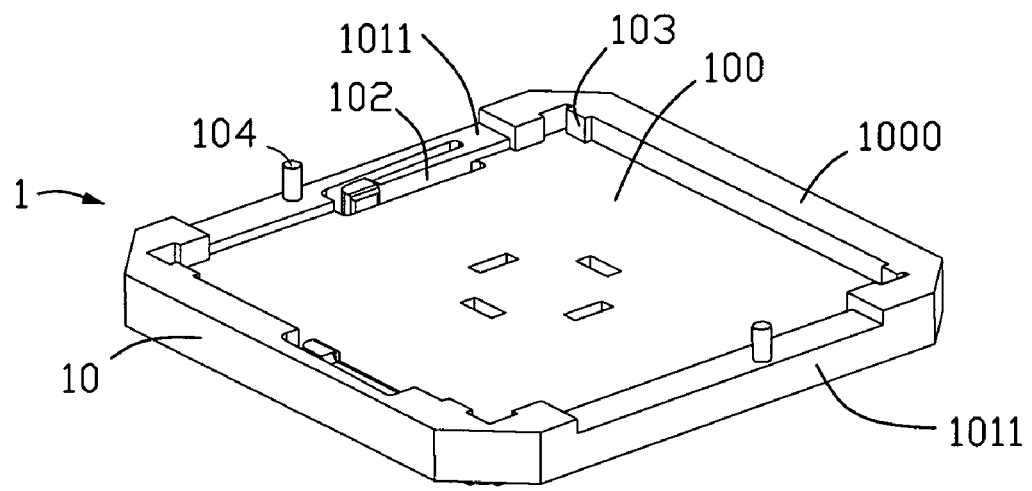
FIG. 3 is a perspective view of a housing of the electrical connector assembly as shown in FIG. 1.
Figure 4:
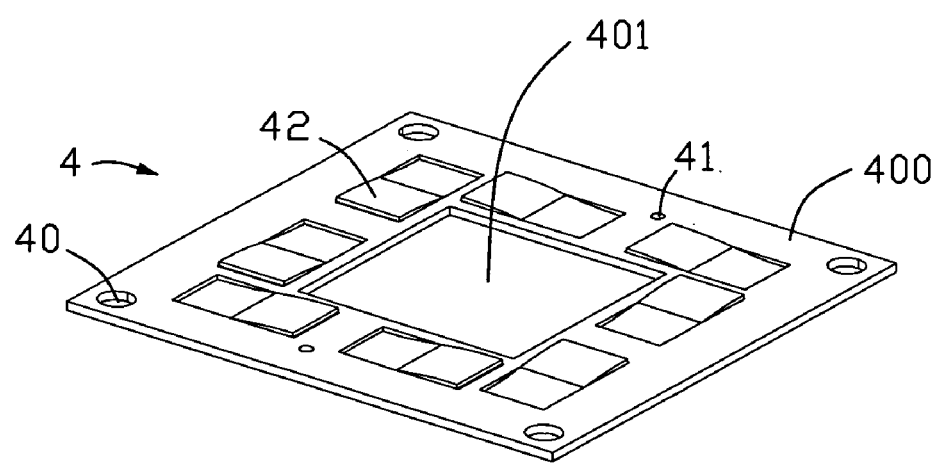
FIG. 4 is a perspective view of a loading plate as shown in FIG. 1.

Referring to FIG. 3, The housing 1 is of rectangular configuration and has a mounting portion 101 soldered to the printed circuit board 3 and a supporting portion 1000 for engaging with the IC chip 2. A plurality of passageways (not shown) are defined in the supporting portion 1000 for receiving a number of electrical contacts (not shown) therein. The mounting portion 101 has four mating walls 1011 surrounding the supporting portion 1000. A number of protrusions 103 and flexible portions 102 extend inwardly from side surfaces of the mating walls 1011 for firmly engaging with the IC chip 2. The housing 1 is provided with a number of projections 104 on the mating wall 1011 for engaging with a plurality of apertures 41 defined on the loading plate 4.

Referring to FIGS. 1-4, the printed circuit board 3 defines four mounting holes 30 thereon for engaging with the first connecting portions 5.

The loading plate 4 has four side portions 400, a central hole 401 defined therebetween and four second mating portions 40 disposed on corresponding corners of the side portions 400. The second mating portion 40 is a second hole 40. The loading plate 4 further comprises a plurality of spring plates 42 projecting from the side portions 400 toward the IC chip 2.

The heat sink 6 has a plurality of first mating portion 60 projecting from a bottom surface thereof. The first mating portion 60 is a post 60 defining a first hole 601 therein.

The first connecting portion 5 has a head 501 and a body portion 502.

In assembly, firstly, the IC chip 2 is located on the supporting portion 1000 of the housing 1. Then the housing 1 is soldered to the printed circuit board 3. Secondly, the loading plate 4 is positioned on the IC chip 2 and the heat sink 6 is located on the loading plate 4. Finally, the first connecting portions 5 insert though the mounting holes 30 and the second holes 40 in a bottom-to-top direction and engage with the first holes 601 for together locking the heat sink 6 and the loading plate 4 to the printed circuit board 3. At that time, the spring plates 42 of the loading plate 4 flexibly resist against the IC chip 2 for firmly electrically connecting the IC chip 2 to the printed circuit board 3.

Figure 5:
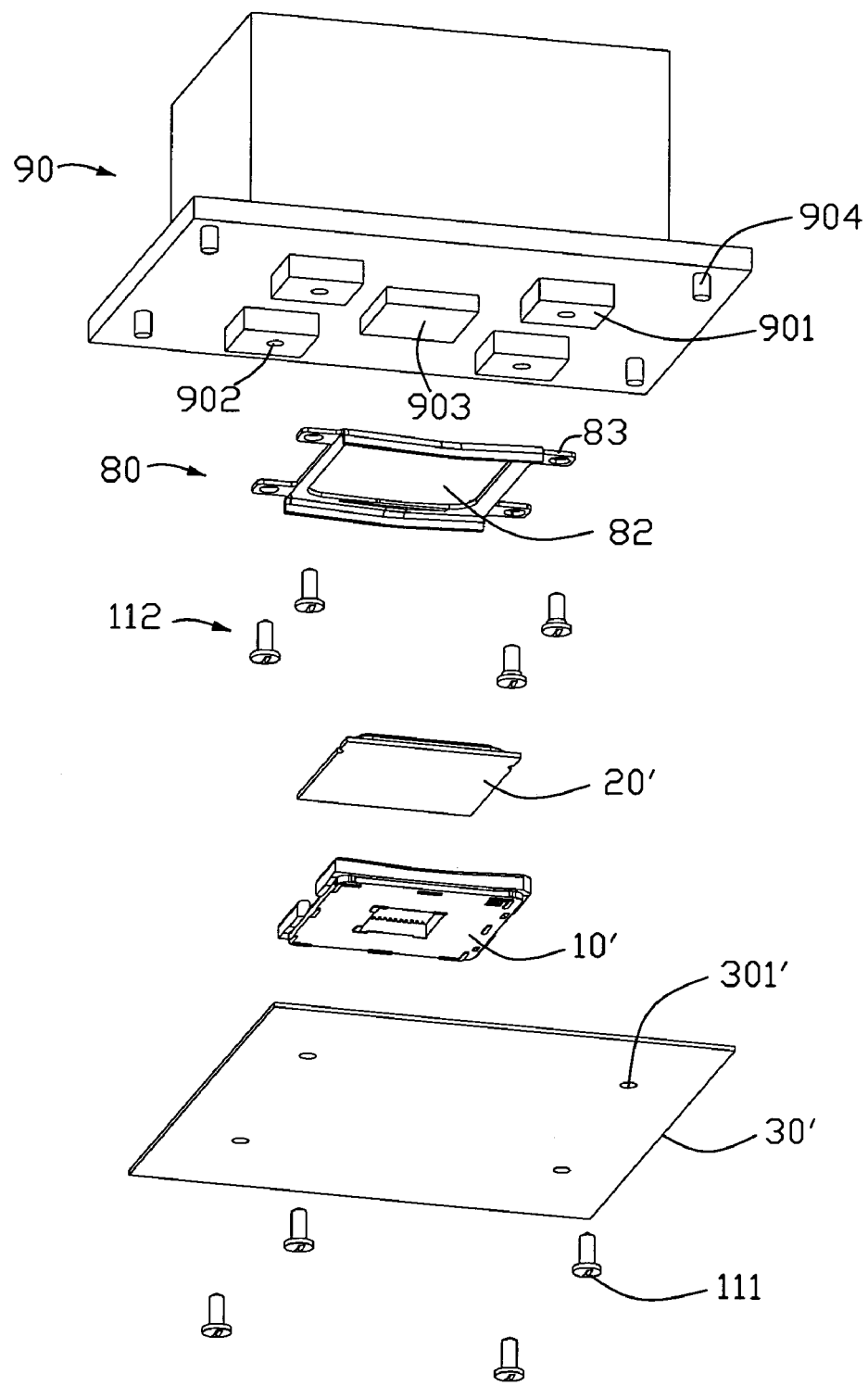
FIG. 5 is an exploded view of an electrical connector assembly in accordance with a second embodiment.
Figure 6:
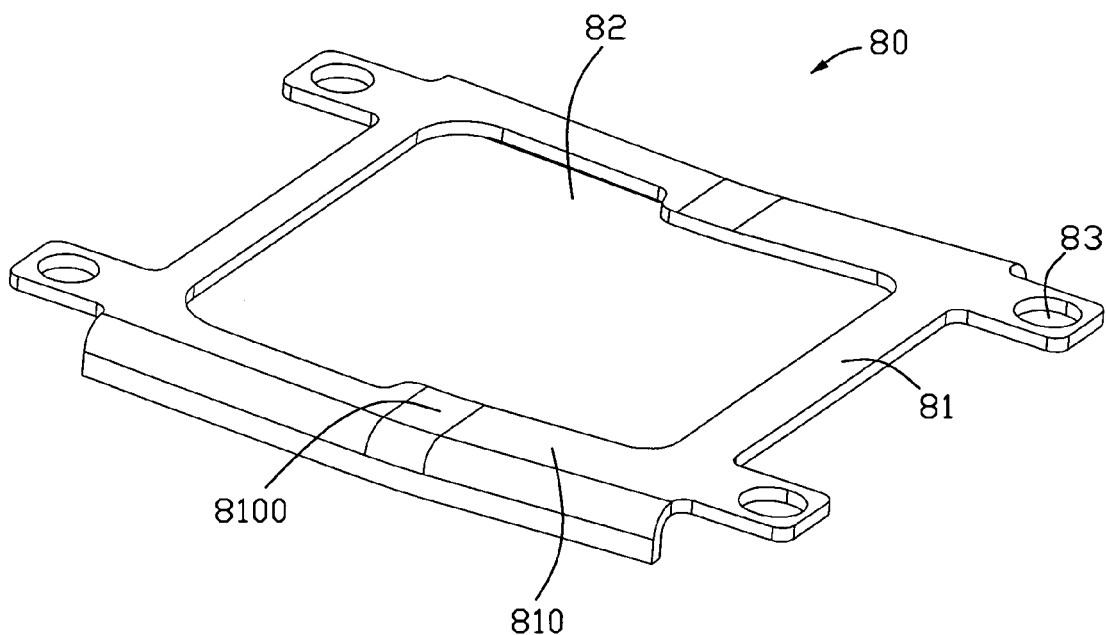
FIG. 6 is a perspective view of a loading plate as shown in FIG. 5.
Figure 7:
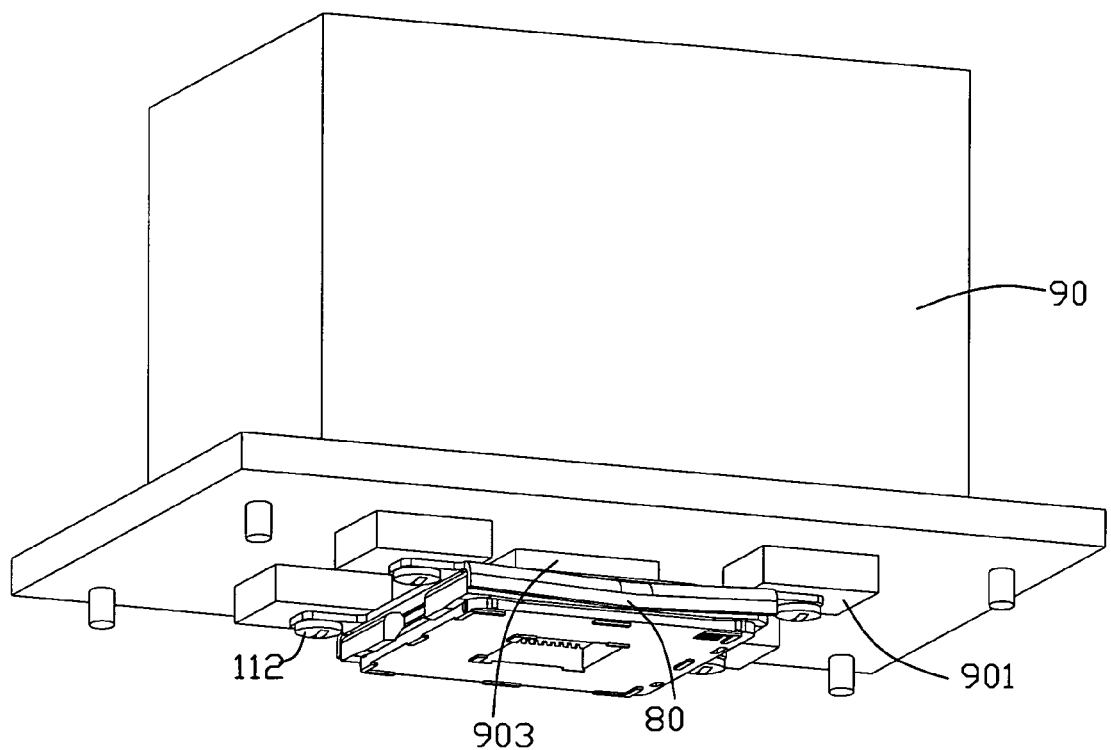
FIG. 7 is an assembled view of the electrical connector assembly as shown in FIG. 5.

FIGS. 5-7 illustrate a second preferred embodiment of the present invention. In this embodiment, an electrical connector assembly for connecting an IC chip 20' to a printed circuit board 30' comprises a housing 10', a heat sink 90 and a loading plate 80 located between the heat sink 90 and the housing 10'.

The housing 10' preferred in the second embodiment has a configuration and structure similar to that of the first embodiment. Detailed description is not illustrated here.

In the second embodiment, the loading plate 80 comprises four side plates 81 and an indentation 82 defined therebetween. A pair of opposite side plates 810 each has a spring plate 8100 extending downwardly therefrom. The heat sink 90 has four engaging portions 901 projecting from a bottom thereof, four first engaging portions 904 and a pressing member 903 extending through the indentation 82 of the loading plate 80 and toward the IC chip 20'. The side plates 81 have a plurality of third holes 83 defined thereon. The printed circuit board 30' comprises four mounting holes 301' defined thereon. The electrical connector assembly has a number of first connecting portions 111 and a plurality of second connecting portions 112 respectively having a configuration similar to that of the first connecting portion 5 in the first embodiment.

During assembly, the second connecting portions 112 insert through the third holes 83 and engage with a plurality of second holes 902 defined in the engaging portions 901 for mounting the loading plate 80 to a bottom of the heat sink 90. Then the first connecting portions 111 insert through the mounting holes 301' and couple with the first engaging portion 904 for locking the printed circuit board 30' to the heat sink 90. At that time, the pressing member 903 firmly resists against the IC chip 20' and the spring plates 8100 also resist against the IC chip 20'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for connecting an IC chip to a printed circuit board, comprising:
   a housing having a supporting portion for engaging with the IC chip and a mounting portion;
   a plurality of contacts mounted to the housing;
   a heat sink comprising a plurality of first mating portions disposed on a bottom surface thereof;
   a loading plate located between the heat sink and the housing and having a plurality of spring plates extending toward the IC chip and in contact with the IC chip, said loading plate having a plurality of second mating portions disposed thereon; and
   a plurality of first connecting portions inserting through the printed circuit board, each first connecting portion engaging with a corresponding first mating portion and a corresponding second mating portion for together locking the heat sink and the loading plate to the printed circuit board.

2. The electrical connector assembly as claimed in claim 1, wherein said printed circuit board defines a plurality of mounting holes thereon, each first connecting portion engaging with a corresponding mounting hole.

3. The electrical connector assembly as claimed in claim 1, wherein each first mating portion is a post defining a first hole therein, each second mating portion is a second hole, each first connecting portion has a head and a body portion inserting through the printed circuit board and the second hole and engaging with the first hole of the post.

4. The electrical connector assembly as claimed in claim 1, wherein said loading plate comprises a plurality of apertures defined thereon, and the mounting portion of the housing has a plurality of protrusions disposed thereon, each protrusion engaging with a corresponding aperture.

5. An electrical connector assembly comprising:
   a printed circuit board;
   an insulative housing mounted upon the printed circuit board;
   a plurality of contacts disposed in the housing and electrically connected to the printed circuit board;
   an IC chip mounted upon the housing and electrically connected to the contacts;
   a load plate positioned upon the IC chip; and
   a heat sink positioned upon the load plate; wherein
   the load plate is equipped with a plurality of spring plates resiliently and tightly sandwiched between the heat sink and the IC chip, and further equipped with a plurality of through holes, and the heat sink is equipped with a plurality of posts aligned with the corresponding through holes, respectively, for assembling the load plate and said heat sink together.

6. The electrical connector assembly as claimed in claim 5, further including a plurality of screws to fasten the printed circuit board and the heat sink together.

7. The electrical connector assembly as claimed in claim 6, wherein said screws extend respectively through the corresponding through holes, and are aligned with and fastened to the corresponding posts, respectively.

8. The electrical connector assembly as claimed in claim 5, wherein each of said spring plates defines two opposite end sections respectively contacting the heat sink upwardly and the IC chip downwardly.

9. An electrical connector assembly comprising:
   a printed circuit board;
   an insulative housing mounted upon the printed circuit board;
   a plurality of contacts disposed in the housing and electrically connected to the printed circuit board;
   an IC chip mounted upon the housing and electrically connected to the contacts;
   a load plate positioned upon the IC chip; and
   a heat sink positioned upon the load plate; wherein
   the load plate is equipped with a plurality of spring plates resiliently sandwiched between the heat sink and the IC chip, and further equipped with a plurality of through holes, wherein
   a plurality of screws extend respectively through both the printed circuit board and the corresponding through holes for securing the load plate and said printed circuit board together.

10. The electrical connector assembly as claimed 9, wherein said screws are further fastened to the heat sink so as to have said spring plates, said IC chip and the housing compactly sandwiched between the printed circuit board and the heat sink.

11. The electrical connector assembly as claimed in claim 10, wherein said heat sink is equipped with a plurality of posts, and said screws are fastened into the corresponding posts, respectively, to fasten said printed circuit board to the heat sink.

12. The electrical connector assembly as claimed in claim 9, wherein each of said spring plates defines two opposite end sections respectively contacting the heat sink upwardly and the IC chip downwardly.

* * * * *